(12) United States Patent
Hanson et al.

(10) Patent No.: US 6,828,811 B2
(45) Date of Patent: Dec. 7, 2004

(54) OPTICS LANDING SYSTEM AND METHOD THEREFOR

(75) Inventors: John Hanson, Mountain View, CA (US); Jonathan Frank, Los Gatos, CA (US); Dario Meluzzi, Mountain View, CA (US); Daniel M. Cotton, Mountain View, CA (US)

(73) Assignee: Credence Systems Corporation, Milpitas, CA (US)

( * ) Notice: Subject to any disclaimer, the term of this patent is extended or adjusted under 35 U.S.C. 154(b) by 0 days.

(21) Appl. No.: 10/255,345

(22) Filed: Sep. 26, 2002

(65) Prior Publication Data

US 2003/0193345 A1 Oct. 16, 2003

Related U.S. Application Data

(60) Provisional application No. 60/371,542, filed on Apr. 10, 2002.

(51) Int. Cl.[7] ........................ G01R 31/02; G01R 31/26
(52) U.S. Cl. ...................................... 324/754; 324/765
(58) Field of Search ................. 324/754, 755, 324/758, 760, 765, 537, 158.1

(56) References Cited

U.S. PATENT DOCUMENTS

| | | | |
|---|---|---|---|
| 3,524,694 A | | 8/1970 | Kelin |
| 3,711,186 A | | 1/1973 | O'Connor |
| 3,912,378 A | | 10/1975 | Goto |
| 4,634,234 A | | 1/1987 | Baumann |
| 5,004,307 A | | 4/1991 | Kino et al. |
| 5,208,648 A | | 5/1993 | Batchelder et al. |
| 5,220,403 A | | 6/1993 | Batchelder |
| 5,282,088 A | | 1/1994 | Davidson |
| 5,475,316 A | * | 12/1995 | Hurley et al. ............... 324/750 |
| 5,940,545 A | | 8/1999 | Kash et al. |
| 6,252,412 B1 | * | 6/2001 | Talbot et al. ............... 324/750 |
| 6,462,814 B1 | * | 10/2002 | Lo ........................... 356/237.2 |
| 6,509,750 B1 | * | 1/2003 | Talbot et al. ............... 324/750 |
| 6,591,121 B1 | * | 7/2003 | Madarasz et al. ........... 356/364 |
| 6,621,275 B2 | * | 9/2003 | Cotton et al. ............... 324/754 |

OTHER PUBLICATIONS

All–Solid–State Microscope–Based System for Picosecond Time–Resolved Photoluminescence Measurements on II–VI semiconductors, G. S. Buller et al., Rev. Sci. Instrum. pp. 2994, 63, (5), (1992).

(List continued on next page.)

*Primary Examiner*—Kamand Cuneo
*Assistant Examiner*—Jermele Hollington
(74) *Attorney, Agent, or Firm*—Joseph Bach; J B Patents.Com

(57) ABSTRACT

A landing system is provided for accurate placing of collection optics in a microscope. In one example, a solid immersion lens (SIL) is used for light collection, and the landing system is operated to place the SIL in contact with an IC. A proximity sensor is used for determining the SIL's position with respect to the IC. The proximity sensor is attached to a z-motion stage. During the placement procedure, the navigation is performed in steps and at each step the compression of the SIL is measured relative to its uncompressed state. When a measured compression exceeds a preset threshold, a SIL landing is recognized. In one example, after a landing is recognized, a further compression is imparted to the SIL in order to place the SIL in a focusing distance to the objective lens.

42 Claims, 5 Drawing Sheets

OTHER PUBLICATIONS

Time–Resolved Photoluminescence Measurements in InGaAs/InP Multiple–Quantum–Well Structures at 1.3–m Wavelengths by Use of Germanium Single–Photon Avalanche Photodiodes, G.S. Buller et al., Applied Optics, vol. 35 No. 6, (1996).

Analysis of Product Hot Electron Problems by Gated Emission Microscope, Khurana et al., IEEE/IRPS (1986).

Ultrafast Microchannel Plate Photomultiplier, H. Kume et al., Appl. Optics, vol. 27, No. 6, 15 (1988).

Two–Dimensional Time–Resolved Imaging with 100–ps Resolution Using a Resistive Anode Photomultiplier Tube, S. Charboneau, et al., Rev. Sci. Instrum. 63 (11), (1992).

Novel Optical Probing Technique for Flip Chip Packaged Microprocessors, Mario Paniccia, Travis Eiles, V.R.M. Rao and Wai Mun Yee Proceedings of 1998 International Test Conference (ITC '98), Oct. 18–22, 1998, Washington, DC, IEEE Catalog No. RS00191.

Diagnosis and Characterization of Timing–Related Defects by Time–Dependent Light Emission, Dave Vallett, Leendert Huisman, and Phil Nigh; Proceedings of 1998 International Test Conference (ITC '98), Oct. 18–22, 1998, Washington, DC, IEEE Catalog No. RS00191:

Contactless Gigahertz Testing, W. Mertin, A. Leyk, U. Behnke, and V. Wittpahl, Proceedings of 1998 International Test Conference (ITC '98), Oct. 18–22, 1998, Washington, DC, IEEE Catalog No. RS00191:.

Picosecond Noninvasive Optical Detection of Internal Electrical Signals in Flip–Chip–Mounted Silicon Integrated Circuits, H. K. Heinrich, IBM J. Res. Develop. vol 34, No. 2/3 1990.

* cited by examiner

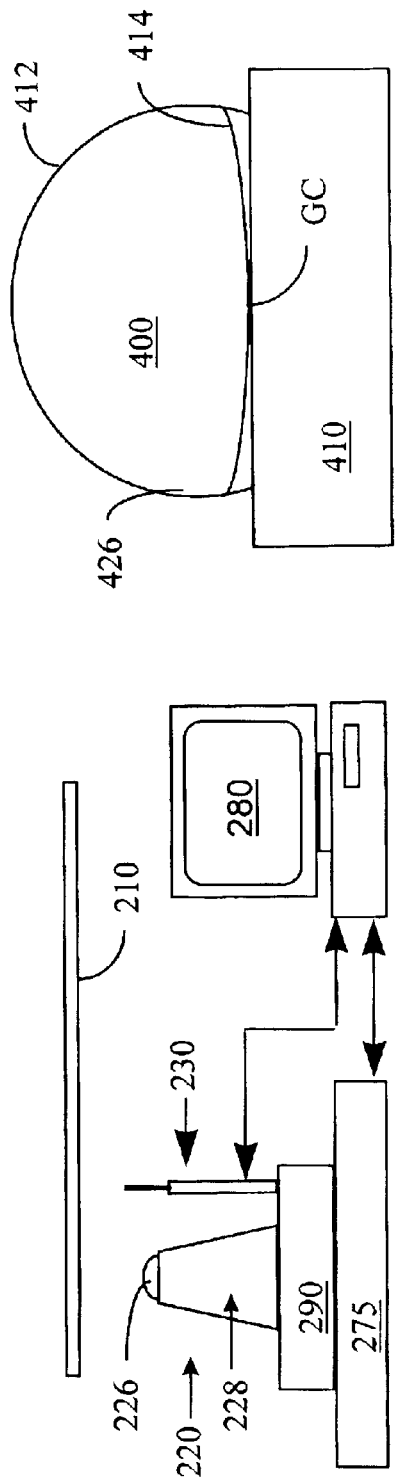
*Figure 2*
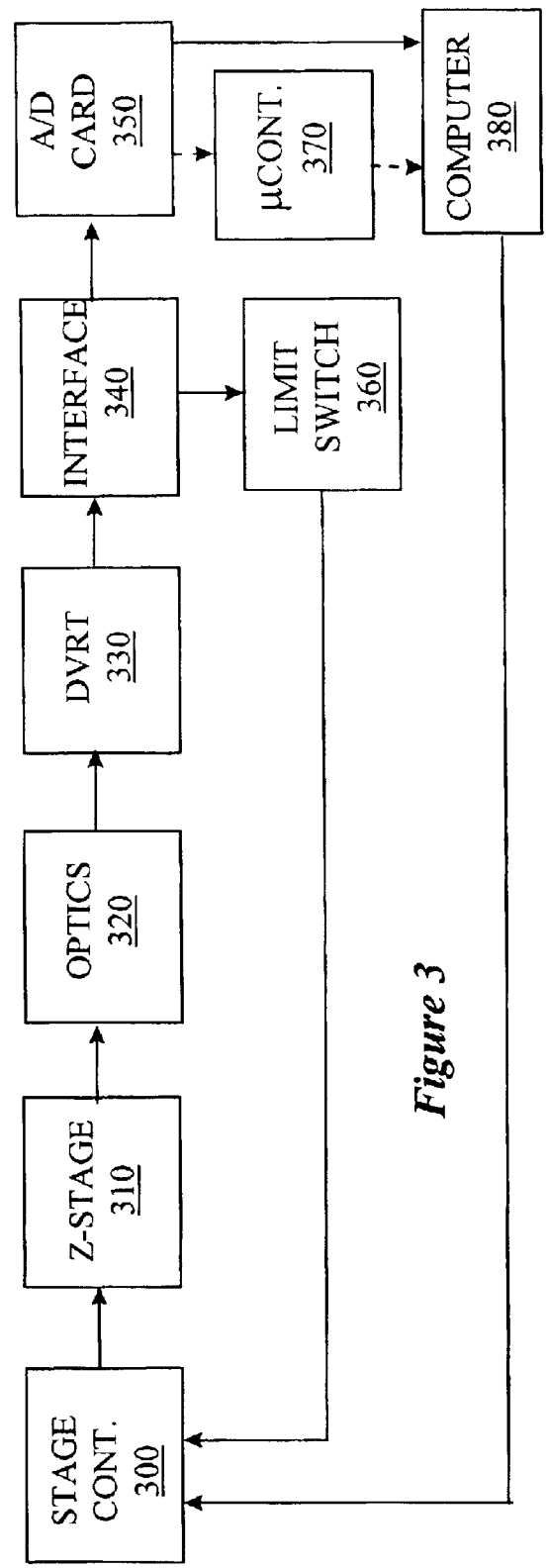
*Figure 4*
*Figure 3*

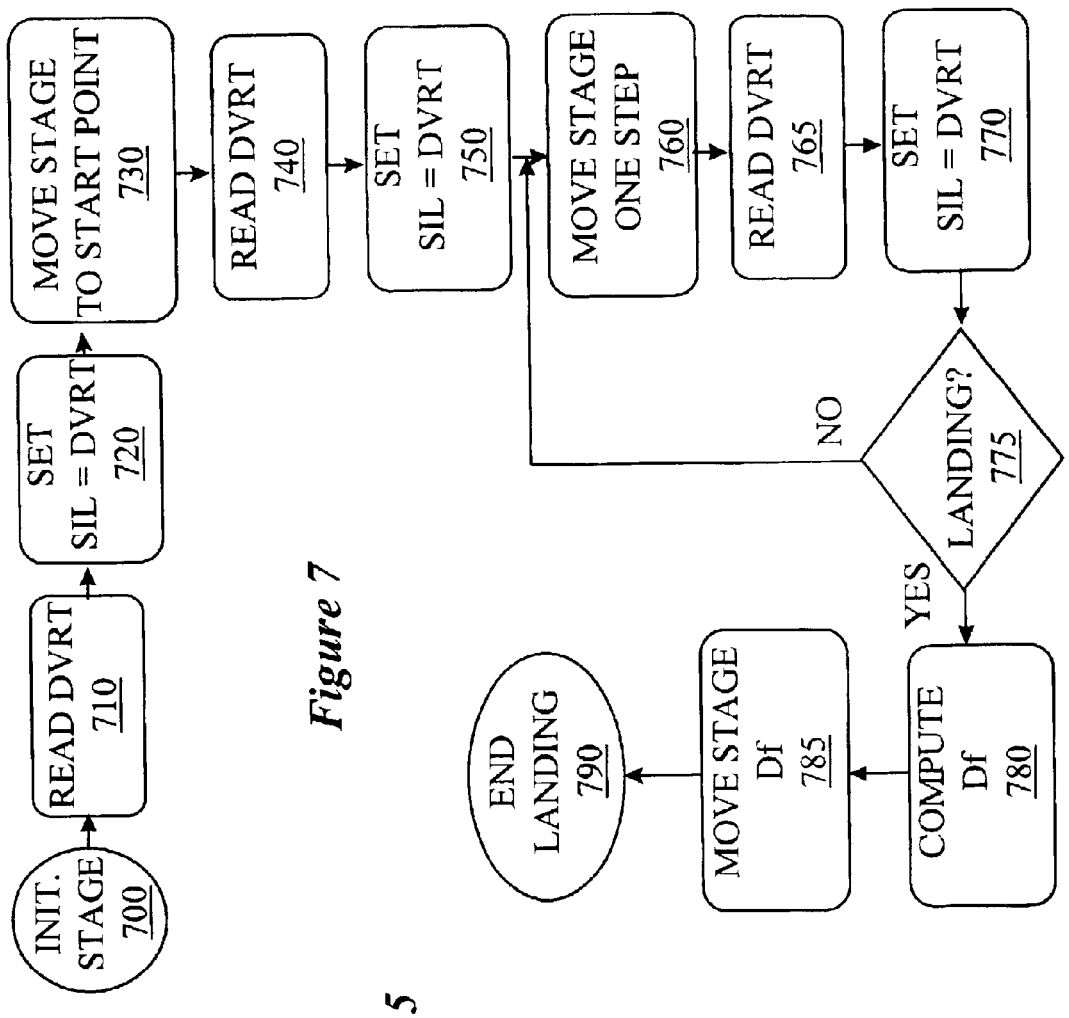
*Figure 7*
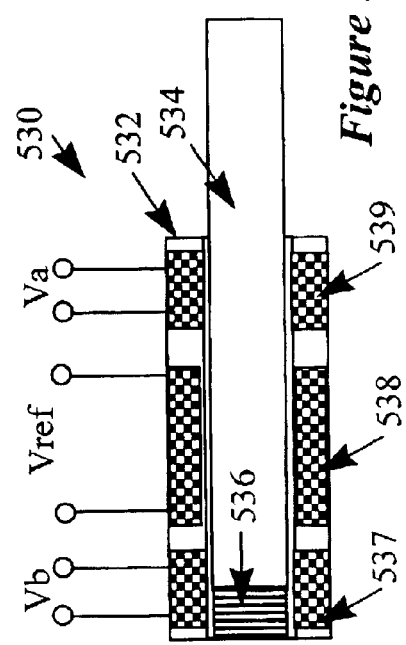
*Figure 5*
*Figure 6*

OPTICS LANDING SYSTEM AND METHOD THEREFOR

This application claims priority from Provisional application Ser. No. 60/371,542, filed Apr. 10, 2002.

BACKGROUND OF THE INVENTION

1. Field of the Invention

The present invention relates to a system for accurate placement of collection optics in microscopes.

2. Description of the Related Art

Various microscopes are used in the art for imaging, testing, and examination of various microstructures. A common feature of these microscopes is that the obtained resolution depends on efficient collection of light from the inspected object. Accurate placing of the collection optics is also highly important for accurate focusing on the object to be inspected. Additionally, to obtain efficient collection of light, the collection optics needs to be accurately placed with respect to the object to be imaged.

While collection efficiency is highly important for many types of microscopes, it is imperative in one particular field: probing and testing of semiconductor microchips. Microchips need to be tested during the design and during the manufacturing stages. One type of testing relies on light emission from the microchip that is generated whenever a device, e.g., a transistor, on the microchip changes state. For further information on this phenomenon and it's investigation, the reader is directed to, for example:

All-Solid-State Microscope-Based System for Picosecond Time-Resolved Photoluminescence Measurements on II–VI semiconductors, G. S. Buller et al., Rev. Sci. Instrum. pp.2994, 63, (5), (1992);

Time-Resolved Photoluminescence Measurements in InGaAs/InP Multiple-Quantum-Well Structures at 1.3-m Wavelengths by Use of Germanium Single-Photon Avalanche Photodiodes, G. S. Buller et al., Applied Optics, Vol 35 No. 6, (1996);

Analysis of Product Hot Electron Problems by Gated Emission Microscope, Khurana et al., IEEE/IRPS (1986);

Ultrafast Microchannel Plate Photomultiplier, H. Kume et al., Appl. Optics, Vol 27, No. 6, 15 (1988); and Two-Dimentional Time-Resolved Imaging with 100-ps Resolution Using a Resistive Anode Photomultiplier Tube, S. Charboneau, et al., Rev. Sci. Instrum. 63 (11), (1992).

Notably, Khurana et al., demonstrated that photoluminescence emission coincides with the switching of a transistor, thereby showing that, in addition to failure analysis, the phenomenon can also be used for device debug and circuit design. See, also, U.S. Pat. No. 5,940,545 to Kash et al., disclosing a system for such an investigation.

As can be appreciated from the above-cited works, the light emission in semiconductor devices is very faint. Accordingly, various optical and detection schemes have been proposed to more efficiently collect the emission and reduce the noise, i.e., increase collection fidelity, bandwidth, and speed. For example, commercially available microchannel photomultipliers have been used to amplify the collected light by factors of a million or so. Also, avalanche diodes coupled to time-to-amplitude converters (TAC) have been used to provide high temporal resolution of the emission.

From the optics perspective, various attempts have been made to increase the collection of light and the resolution by increasing the numerical aperture (NA=n*sin θ; n being the index of refraction and θ being the collection angle) of the objective lens. It has been long known that increasing the numerical aperture can be achieved by increasing the index of refraction, n, to be above that of air. One historical method for increasing n is to fill the gap between the objective lens and the object with an index matching oil. Another method is to use an immersion lens between the object and the objective lens. Of course, one may use both techniques, i.e., use immersion lens and index matching fluid. The use of the above techniques is disclosed in, for example, U.S. Pat. No. 3,524,694, 3,711,186, and 3,912,378. More modern discussions of immersion lenses can be found in U.S. Pat. No. 4,634,234, 5,004,307, 5,208,648, 5,282,088 and Solid Immersion Microscopy, S. M. Mansfield, G. L. Report No. 4949, Stanford University 1992. Prior art immersion lenses are plano-convex (i.e., hemispheres). That is, the bottom surface, i.e., the surface facing the object, is flat, while the top surface, i.e., the surface facing the objective lens, is convex.

A semiconductor device of particular interest to the present invention is generally referred to as a "flip chip." Since the structure of flip chips is known, it will not be discussed here in detail. Information relating to flip chips can be found in, for example, http://www.flipchip.com and http://world.std.com/~hycomp/flippage.html. Of specific interest is recent effort in the art to inspect such devices from the back side, i.e., from the substrate side. One problem in testing flip chips using conventional methods, such as e-beam testing, is that the metal lines are not readily accessible as in other integrated circuits. Therefore, in order to expose the metal lines to the e-beam tester, one needs to employ a forced ion beam (FIB) to "drill" through the substrate and expose the metal lines. However, with the density of today's IC's, the active devices occupy much of the "real estate" available on the substrate, thereby rendering the use of FIB impossible. Therefore, the mechanism of light emission described above has been employed also for probing flip chips from the back side. The reader is directed to these three articles, published in the Proceedings of 1998 International Test Conference (ITC '98), Oct. 18–22, 1998, Washington, D.C., IEEE Catalog No. RS00191:

Novel Optical Probing Technique for Flip Chip Packaged Microprocessors, Mario Paniccia, Travis Eiles, V. R. M. Rao and Wai Mun Yee.

Diagnosis and Characterization of Timing-Related Defects by Time-Dependent Light Emission, Dave Vallett, Leendert Huisman, and Phil Nigh.

Contactless Gigahertz Testing, W. Mertin, A. Leyk, U. Behnke, and V. Wittpahl.

Another article of interest is Picosecond Noninvasive Optical Detection of Internal Electrical Signals in Flip-Chip-Mounted Silicon Integrated Circuits, H. K. Heinrich, IBM J. Res. Develop. Vol 34, No. 2/3 1990.

Systems for imaging flip-chips from the backside through the silicon substrate are described in U.S. Pat. Nos. 5,208, 648, 5,220,403 and 5,940,545.

However, in spite of the amount of work in the field, there is still no commercially viable system for device debug by time resolved measurements of hot electron emission, as opposed to device illumination. For example, one of the issues causing difficulties is the efficient collection of the faint light emission. Such an efficient collection requires highly accurate control and placement of the collection optics.

SUMMARY OF THE INVENTION

The present invention provides a landing system and method that enables accurate control and placement of the collection optics for a microscope.

In one aspect of the invention, a landing system is provided for an integrated system for testing an integrated circuit (IC). In this particular example, a solid immersion lens (SIL) is used for light collection, and the landing system is operated to place the SIL in contact with the IC.

In another aspect of the invention, the inventive system comprises a proximity sensor for determining the SIL's position with respect to the microscope's objective. In one particular implementation, the proximity sensor is a physical contact sensor, e.g., a strain gauge or a differential variable reluctance transformer (DVRT), attached to a z-motion stage. This arrangement is coupled to an x-y stage that is used to move the optics to the location of interest on the device under test. During the placement stage, the navigation is performed in steps and at each step the compression of the SIL is measured relative to its uncompressed state. When a measured compression exceeds a preset threshold, a SIL landing is recognized. In one example, after a landing is recognized, a further compression is imparted to the SIL in order to place the SIL in a focusing distance to the objective lens.

In yet another aspect of the invention, a SIL housing is movably mounted onto an objective lens housing. One part of a displacement sensor, e.g., a strain gauge or a differential variable reluctance transformer (DVRT), is attached to the SIL housing, while the other part is attached to the objective housing. This arrangement is coupled to an x-y-z stage that is used to move the optics to the location of interest on the device under test. During the placement stage, the navigation is performed in steps and at each step the motion of the SIL housing with respect to the objective housing is measured. When a measured motion exceeds a preset threshold, a SIL landing is recognized. In one example, after a landing is recognized, a further compression is imparted to the SIL in order to place the SIL in a focusing distance to the objective lens.

In a further aspect of the invention, a SIL housing is movably mounted onto an objective lens housing. The SIL housing is spring-loaded against the objective housing so as to impart a non-linear resistive force to compression of the SIL housing against the objective housing. A first linearly increasing force is imparted in a first compression range, defining a SIL landing range. Once the compression has surpassed the first compression range, indicating a SIL landing, a constant force is imparted over a second compression range, defining a focusing range. The variable source is provided by, for example, a non-linear spring, a dual-spring arrangement and the like.

According to a particular feature of the invention, the landing system is further provided with an interrupt to avoid damage to the SIL. The signal from the DVRT is fed to a Schmidt trigger that compares the signal to a preset limit. When that limit is exceeded, an interrupt signal shuts down the stage to prevent damage to the SIL.

BRIEF DESCRIPTION OF THE DRAWINGS

The invention is described herein with reference to particular embodiments thereof which are exemplified in the drawings. It should be understood, however, that the various embodiments depicted in the drawings are only exemplary and may not limit the invention as defined in the appended claims.

FIG. 2 depicts an embodiment of the landing system according to an embodiment of the invention.

FIG. 3 depicts a block diagram of a landing system according to an embodiment of the invention.

FIG. 4 depicts a bi-convex solid immersion lens that can be used with the landing system of the invention.

FIG. 5 depicts a differential variable reluctance transformer for use as a proximity sensor according to an embodiment of the invention.

FIG. 6 depicts an arrangement of collection optics and proximity sensor according to an embodiment of the present invention.

FIG. 7 is a block diagram of a routine of a method according to an embodiment of the invention.

DETAILED DESCRIPTION

Figure 1A:
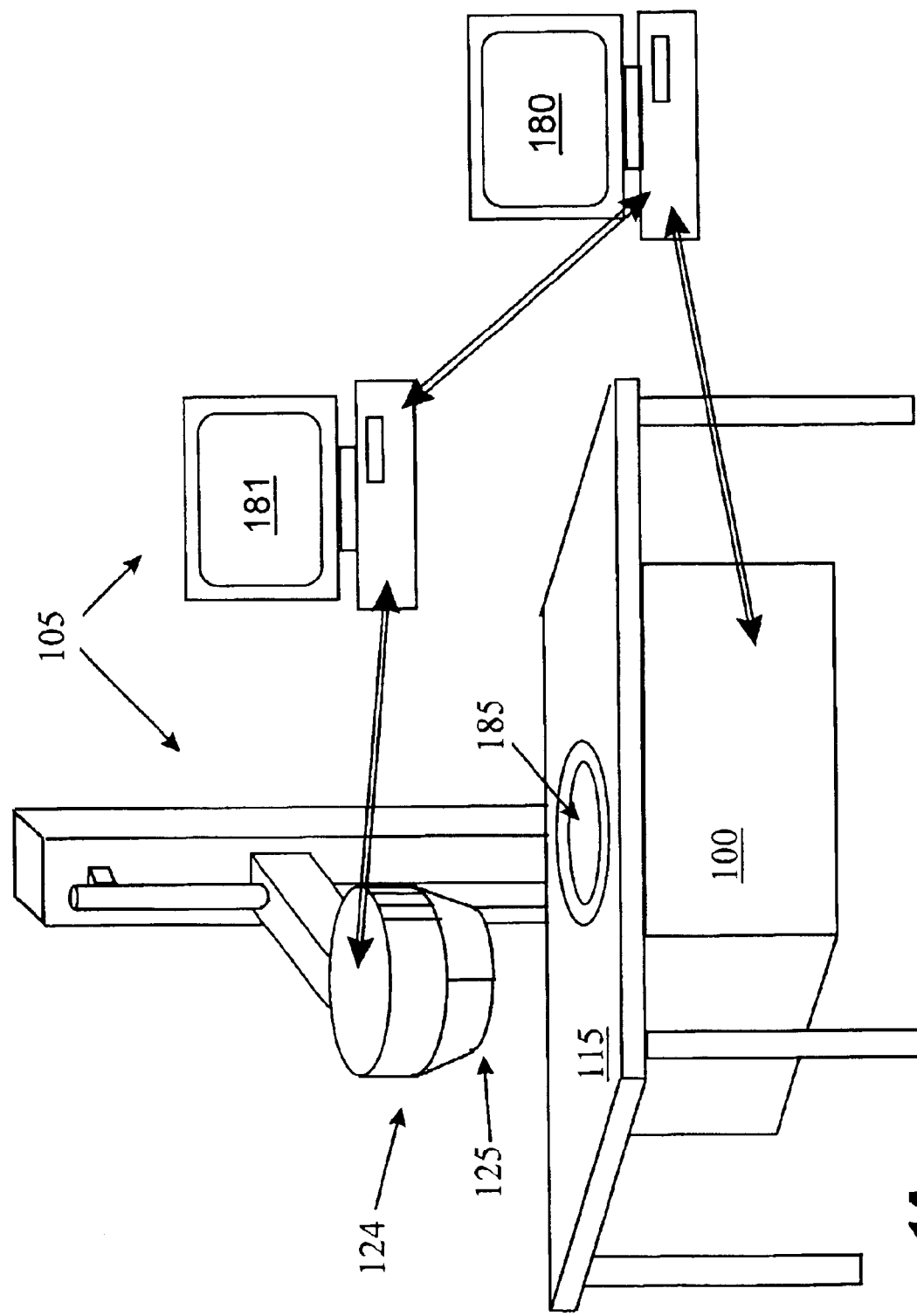
FIGS. 1A–1B are general schematics depicting the major components of a testing and debug system which may be used with the landing system according to embodiments of the invention.
Figure 1B:
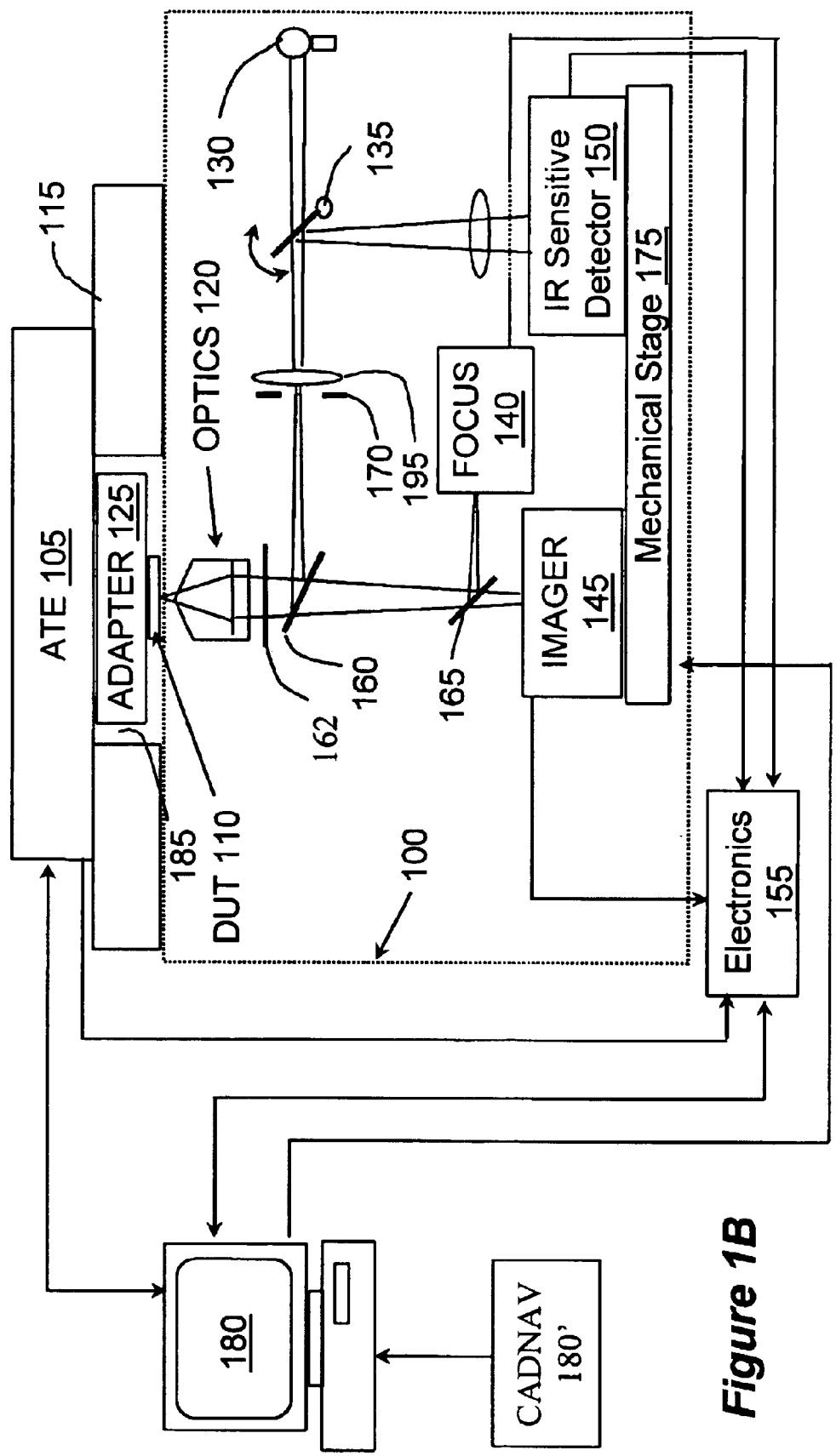

The present invention provides a landing system for a soft touchdown and accurate placing of collection optics of microscopes. The system can be used with various arrangements of collection optics, and is especially beneficial for use in microscopes designed for detection of faint light emissions. An example of such a microscope is depicted in FIGS. 1A and 1B, illustrating an IC test and debug system. Of course, the inventive landing system is suitable for use with other systems; however, for illustration purposes, various embodiments of the inventive landing system will be described with reference to the test and debug system of FIGS. 1A and 1B.

FIGS. 1A and 1B are general schematics depicting the major components of the testing and debug system particularly suitable for timing and other testing of microchips, especially from the backside through the substrate (e.g., flip chips). The system operates in conjunction with a commercially available automated testing equipment 105 (ATE). The ATE generally comprises a controller, such as a preprogrammed computer 181, and a test head 124 which comprises an adapter 125 used to deliver signals generated by the controller 181 to the device under test (DUT) 110 in a manner well known in the art. Specifically, the ATE is used to generate signals that stimulate the DUT to perform various tasks, as designed by the chip designer to check and/or debug the chip. The various signals generated by the controller 181 are delivered to the DUT via the adapter 125. The adapter 125 may include a space transformer, a DUT load board and a DUT socket, in a manner well known in the art.

In the embodiment depicted in FIGS. 1A and 1B, the ATE test head is placed on top of a vibration isolated test bench 115, while the chamber 100 that houses the entire optics, imaging and sensing system, and an X-Y-Z stage 175, is situated below. This provides a tremendous advantage as it allows the system to be used with any type and size of ATE without interference with, or making modification to any of the elements inside chamber 100. Rather, the ATE is used to place the DUT from above, so that it is visible to the optics 120 via opening 185. Stage 175 enables placing of the collecting optics at any locations within the opening 185.

The various elements of the system of FIGS. 1A and 1B will be described with reference to its operational modes. Generally, the system operates in two modes: navigation mode and detection mode. In the description, references to "navigation mode" should be understood to include navigation, target acquisition, and imaging. Therefore, these terms may be used interchangeably herein.

In the navigation mode, an illumination source 130 is used to illuminate the DUT. Illumination source 130 emits light in the infrared range using, for example, an IR laser, tungsten, or a halogen lamp. The light is focused onto and then reflects from the DUT to be collected by the collection optics 120 and selectively directed towards the imager 145 via quarter wave plate 162 and dichroic mirror 160. The imager 145 can be any two-dimensional detector capable of imaging in the infrared range, such as, for example, a silicon intensifier vidicon. IR vidicons are commercially available from, for example, Hamamatsu (http://usa.hamamatsu.com). Beam splitter mirror 165 is used to deflect part of the collected light to the focusing system 140. Alternatively, the signal of the imager 145 may be used for focusing.

The collection optics 120 may be connected to the x-y-z stage 175. During placing of the collection optics 120, the z motion is controlled using implementation of the present invention, as will be described in more detailed below.

The switchable mirror 135 selectively varies the optical path between the navigation and detection modes. For that purpose, mirror 135 may be mechanically moved or rotated, or it may be made of an active element capable of variable reflectivity according to the selected mode so that, for example, in one mode it is totally reflective, while in the other mode it is totally transmissive. For a rotational implementation, a substrate may be made having half of it transmissive and the other half reflective. Such a substrate can be provided with a rotating mechanism to insert in the optical path the reflective of transmissive part as desired.

Additionally, a mechanized aperture 170 is provided at the image plane of the collection optics 120, together with field lens 195. Notably, in this example, the image plane of collection optics 120 is generated in two locations: at aperture 170 and at the detector 145. The mechanized aperture 170 is illuminated from behind and is used to define the field of view at the image plane. That is, depending on the particular test to be run, one may wish to select any particular section of the DUT for emission. Using information about the chip design and layout stored in a CAD software, such as, for example, Cadence, and using navigation software, such as, for example, Merlin's Framework available from Knights Technology (www.electroglass.com), one may select a particular device for emission test. When the user selects a device or location, the system activates the stage 175 so that the collection optics is centered on the selected device or location. Then, the aperture 170 may be adjusted to increase or decrease the field of view as appropriate for the particular test desired.

When an appropriate field of view has been set and an image focused, mirror 135 is rotated so that the light path towards the IR sensitive detector 150 is established. Additionally, light source 130 is shut off or blocked during testing. It should be appreciated, of course, that chamber 100 prevents any exterior light from reaching any of the optics, imagers and sensors enclosed within.

Photon sensing during testing is done by detector 150, which may be an infrared sensor, such as a photomultiplier tube (PMT), a photocathode coupled to a multichannel plate (MCP), an avalanche photodiode (APD), etc. The signal from the detector 150 is sampled by the high-speed data acquisition electronics 155. Controller 180, which may be a general-purpose computer running dedicated software, is used to control the various elements of the system, such as the stage and sampler. The controller 180 receives sync signals from the ATE 105.

In order to maximize photon collection during testing, collection optics 120 includes a solid immersion lens (SIL). The SIL may be such as the ones disclosed in U.S. Pat. Nos. 5,004,307, 5,208,648 and 5,282,088, or any other suitable immersion lens. However, in this embodiment a novel bi-convex SIL is used. FIG. 4 depicts an embodiment of the bi-convex SIL 400. Specifically, the upper surface 412 is convex in the form of a hemisphere with radial geometrical center at GC. The bottom surface 414 is convex, but having a radius of curvature that is much larger than that of the upper surface. The radius of curvature of the bottom surface, 414, is, for example, at least an order of magnitude larger than that of the upper surface 412. The lowest point of the bottom surface, 414, passes through the radial geometrical center, GC, of the upper surface.

In usage, the lowest point on the bottom surface may come in contact with the object to be imaged 410, while the periphery of the bottom surface at a few tens of nanometers therefrom. However, lens 400 can also be used with a gap of up to about 200 nanometers from the object, wherein the gap is filled with either air or index matching material or fluid. In such a configuration, the periphery of the bottom surface would be a few tens of nanometers further from the object than the lowest point.

Since in the embodiment of FIG. 4 the bottom surface, 414, is convex, it has a small and defined "point of contact" with the object. Note that even if the lens does not contact the object, almost all of the radiation energy transmitted between the lens and the object would pass through the lowest point of the convex bottom surface 414 of the lens, which is loosely defined herein as the "point of contact." The small and defined point of contact allows for accurate determination of the point on the object that is being imaged. Also, by pressing the SIL against the DUT, the DUT may be deformed about the point of contact, thereby controlling the surface contact of the SIL and the amount of light collected.

FIG. 2 depicts an embodiment of the landing system of the present invention. Collection optics 220 is used to collect light from DUT 210. In this embodiment, collection optics 220 includes a SIL 226 and an objective lens inside housing 228. The collection optics is mounted to a z-axis actuator 290 of an x-y stage 275. The motion of the stage and actuator is controlled by a computer 280, which may be an all purpose computer programmed to perform specific tasks in accordance with embodiments on the invention.

A feature of this illustrative embodiment of the invention is that it controls the placement of the optics 220 with respect to the DUT 210. Advantageously, the depicted embodiment is capable of controlling a "soft" landing of the SIL 226 onto the DUT 210, and exerting a pre-specified pressure onto DUT 210 by the SIL 226. That is, as can be understood, until the SIL is "coupled" to the DUT, no image can be obtained, so there's no way to determine where the SIL is with respect to the DUT. (The term "coupled" means to allow communication of evanescent wave energy. In other words, the SIL is coupled to the DUT when it captures rays propagating in the DUT at angles higher than the critical angle. As is known in the art, the coupling can be achieved by, for example, physical contact with the imaged object or very close placement of up to about 200 nanometers from the object.) To that end, a physical contact sensor, e.g., a compression sensor or a strain gauge 230 is mounted onto the actuator 290 and/or housing 228 to serve as a proximity sensor so that the location of the SIL with respect to the DUT can be determined. That is, in this embodiment the compression sensor 230 moves together with housing 228, so that its physical location is always known with respect to the SIL 226.

In the illustrative embodiment depicted in FIG. 2, the compression sensor may be implemented in the form of, for example, a conventional strain gauge. Alternatively, a differential variable reluctance transformer DVRT may be used. More specifically, a DVRT in the form of an inverse solenoid may used. An example of a DVRT that can be used in the embodiment of FIG. 2 is depicted in FIG. 5, showing a magnetic core 534 that slides within a housing 532. The magnetic core 534 may be spring loaded by spring arrangement 536. The housing 532 houses a plurality of coils; in this embodiment one main coil 538 and two secondary coils 537 and 539. In this embodiment, Va and Vb are connected in series to secondary coils 537 and 539, respectively, but with opposite phase so that Va and Vb are subtracted from each other. When core 534 moves, the output voltage Vref changes and forms the output signal of the DVRT. Further information about DVRT and various circuitries can be found in the article entitled Accurate Linear Measurement Using LVDTs by George Novacek, which can be found at www.chipcenter.com/embapps/emba058.htm.

According to an embodiment of the invention, the compression sensor is used to precisely place the SIL in contact, and under pressure, with the DUT. A block diagram of an embodiment of the inventive landing system that can be used for that purpose is depicted in FIG. 3. A stage controller 300 controls the motion of the stage actuators and the landing routine starts after the controller brings the optics 320 in x-y registration with the location on the DUT sought to be examined. Then, the controller advances the z-motion actuator towards the DUT in a step-wise motion to provide a "soft" landing of the SIL onto the DUT. After each step, typically 10 $\mu$m to 100 $\mu$m increment, the compression signal from the DVRT 330 is sent to the computer 380 via interface 340 and A/D card 350, either directly or through optional micro controller 370. The computer 380 compares the signal to the signal obtained from the DVRT when it is in its uncompressed state. In this manner, the computer recognizes when the SIL contacts the DUT. In one embodiment, the computer instruct the stage controller to perform z-motion steps until compression reading of the DVRT exceeds a preset value, typically 4 $\mu$m to 10 $\mu$m, at which point landing is recognized.

As demonstrated in FIG. 3, a safety feature is incorporated into this embodiment of the inventive system. Specifically, a hardware interrupt is provided to prevent damage to the SIL in case the stage controller moves the SIL beyond a set compression limit. In this example, this is done using a limit switch 360, for example, a Schmidt trigger, that receives the DVRT signal from the interface 340. The switch 360 compares the signal to a preset signal, e.g., a set potentiometer voltage. When the DVRT signal exceeds the preset signal, the stage is shut down via an external interrupt line that overrides the signal from the computer 380.

A further feature of the inventive system is depicted in FIG. 6. In FIG. 6, the SIL 626 and an objective lens 654 are housed in collection optics housing 628. The SIL 626 is attached to bracket 644 that is spring loaded by springs 627. In this manner, the distance Df is variable and is used to perform focusing of the image. Specifically, once landing is detected, the computer 380 calculates a distance Df required for start of focusing routine. The distance is calculated by knowing the relationship between the position of the core 634 of the DVRT 630 and the SIL 626. That is, a calibration can be made beforehand, so that motion of the SIL in the Df direction is correlated with the output of the DVRT. The stage controller 300 then moves the optics 320 into start focusing position, which may be a further compression of up to, for example, 750 $\mu$m, but more typically 100–200 $\mu$m. In this example, the hardware limit is set to 750 $\mu$m, so if the computer sends a start of focus signal that requires a motion beyond 750 $\mu$m, the stage will be shut down by the switch 360. Of course, a check routine may additionally be implemented in computer 380 to check whether the calculated motion is beyond the switch limit and, if so, avoid sending the signal to the stage controller 300, but instead issue a warning to the user.

FIG. 7 is a flow chart depicting a method for SIL landing according to an embodiment of the invention. This method may be implemented as a subroutine performed by a general purpose or a dedicated computer. The subroutine may be implemented in software, hardware, or a combination thereof. First, the routine initializes the stage (690, FIG. 6), reads the (uncompressed) DVRT output, and sets the SIL compression equal to the read DVRT output (steps 700, 710, and 720, respectively). Then, the routine moves the stage to the starting point for the landing (Step 730). In this embodiment, this starting point is a fixed z position of the collection optics with respect to the DUT (610, FIG. 6) to be investigated. This location may be entered manually by the user, or automatically using a pre-programmed testing routine. This starting location may be calculated to be, for example, 0.1–1.0 mm in front of the DUT, but typically about 0.5 mm. This may depend on factors such as uncertainty in the position of the DUT surface relative to the z-stage position, due to, for example, DUT surface irregularities, DUT mounting errors, and SIL housing uncertainty.

Once the system has stabilized in its starting point, optionally the computer again reads the DVRT (Step 740) and sets the SIL compression to the DVRT value (Step 750) in order to ensure accurate correlation between the SIL position and the DVRT compression. Then, the computer sends a signal to the controller to move the z-stage one step, reads the DVRT, and sets the SIL current position to the DVRT compression. (steps 760, 765 and 770, respectively). The routine then checks to see if landing has occurred (Step 775). This can be done by comparing the current DVRT reading to the initial or the previous one, or comparing the current DVRT reading to a compression signal Vref, as explained above with respect to FIG. 5. If no landing has been detected, the routine goes back to step 760 and performs another one step motion. If a landing has been detected, the routine calculates the SIL motion required to bring it to distance Df required for start of focusing operation (Step 780). This distance can be calculated from the known position of the SIL, obtained by correlating the DVRT reading. The computer then instructs the stage controller to move the stage in the z-direction the required amount so as to compress the SIL against the spring 627 until distance Df has been achieved (Step 785). Then, the routine is completed (Step 790) and a hand-off to a focusing routine can be performed, or the user may be provided the option to perform manual focusing.

An optional step in the embodiment of FIG. 7 relates to the decision of landing. Specifically, in step 775, landing can be recognized only after it has been determined that the SIL has been compressed against springs 627 for a pre-determined distance. In one example, the distance is 4–10 μm. Thus, until the DVRT measurement shows that the compression exceeds this threshold. No landing is recognized and the routine goes back to step 760.

Figure 8:
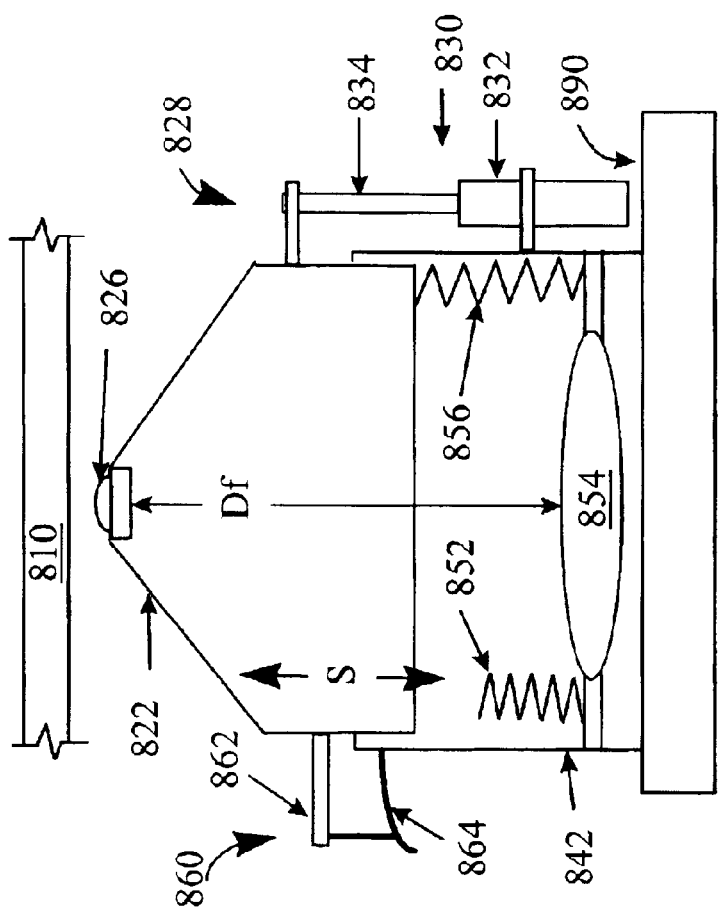
FIG. 8 depicts an arrangement of collection optics and proximity sensor according to an embodiment of the present invention.

Yet another embodiment is depicted in FIG. 8. In the embodiment of FIG. 8, the SIL 826 is fixedly attached to the SIL housing 822, and the objective lens 854 is fixedly attached to the objective housing 842 on base 890. The SIL housing 822 can slide with respect to the objective housing, as exemplified by arrow S. In this manner, the distance Df can be varied. To determine the position of the SIL with respect to the objective lens, a proximity sensor is provided. While any proximity sensor may be used, two alternatives 828 and 860 are depicted as examples. In one example, a DVRT 830 is used, having its base 832 attached to the objective housing and its movable core 834 attached to the SIL housing. In this manner, any motion of the SIL housing 822 with respect to the objective housing 842 necessarily causes a motion of the core 834 with respect to the base 832 of the DVRT. Consequently, the readout of the DVRT can be correlated to the distance Df.

Another example of a proximity sensor is a strain gauge arrangement 860. A lever 862 is fixedly attached to the SIL housing 822, and is urged against a strain gauge 864. The strain gauge 864 is attached to the objective housing 842. When the SIL housing 822 slides towards the objective housing 842 the level 842 strains the strain gauge 864, so that its signal can be correlated to the position of the SIL housing 822. As can be understood, other proximity sensors may be used. For example, capacitive sensing system can be used to measure change in electrical capacitance as the SIL housing moves with respect to the objective housing. Similarly, optical system, such as, for example, an interferometer or change in light intensity, can be used to measure the SIL housing's motion. Accordingly, the term proximity sensor is meant to cover any such measurement system.

Figure 9:
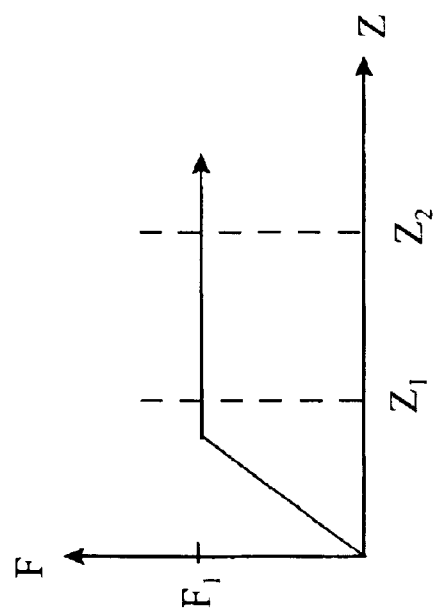
FIG. 9 is a force vs. distance graph for a spring load mechanism according to an embodiment of the invention.

A feature of the embodiment of FIG. 8 is the use of non-linear resistive force opposing the sliding of the SIL housing 822 towards the objective housing 842. This non-linear force can be provided by, for example, a non-linear spring, e.g., 856, or a combination of two linear springs, e.g., 856 and 852, having two different spring constants. What is sought to be achieved is depicted in FIG. 9, which is a graph of force vs. sliding distance, Z, of the SIL housing. As shown in FIG. 9, as the SIL housing starts to slide towards the objective housing 842, it first encounters a linearly increasing force, which may be resulting from, for example, a linear spring 856. Once the SIL objective reaches a certain distance Z, the force is designed to be about constant. This can be achieved by the SIL housing urging against, for example, a second loaded spring 852.

In operation, the optics arrangement of FIG. 8 is advanced towards the DUT 810, either stepwise, as described above, or in continuous motion, until a landing is detected. The landing can be detected by a signal of the proximity sensor, for example, by sensing compression of the DVRT or the strain gauge. The optics arrangement is then further advanced so that the SIL is urged against the DUT with a force equal to the constant force F1. As exemplified in FIG. 9, the SIL housing then may be moved in the range Z1–Z2, which is the range where focusing is performed. Thus, using this embodiment, motion of the SIL to obtain various focusing distances Df does not result in different pressures exerted on the SIL.

While the invention has been described with reference to particular embodiments thereof, it is not limited to those embodiments. Specifically, various variations and modifications may be implemented by those of ordinary skill in the art without departing from the invention's spirit and scope, as defined by the appended claims. For example, while the proximity sensor used in the various examples is in the form of a contact sensor, other techniques, such as, for example, optical interferometric techniques may be used. Additionally, all of the above-cited prior art references are incorporated herein by reference.

What is claimed is:

1. A landing system for accurately placing collection optics to inspect a specimen, comprising:

a z-motion actuator;

a case situated on said actuator and housing collection optics therein;

a proximity sensor providing signals correlated to the proximity of said collection optics to said specimen;

a controller receiving the signals from said proximity sensor and providing output signal for controlling said actuator.

2. The system of claim 1, wherein said proximity sensor comprises a differential variable reluctance transformer.

3. The system of claim 2, wherein said collection optics comprises a solid immersion lens.

4. The system of claim 3, wherein said solid immersion lens comprises a bi-convex solid immersion lens.

5. The system of claim 3, wherein said solid immersion lens is spring loaded with respect to said case.

6. The system of claim 3, wherein said collection optics further comprises an objective lens.

7. The system of claim 1, wherein said collection optics comprises a solid immersion lens resiliently held is said case and an objective lens situated inside said case; and wherein said proximity sensor comprises a physical contact sensor.

8. The system of claim 7, wherein said solid immersion lens is a bi-convex immersion lens, and wherein said physical contact sensor is a differential variable reluctance transformer.

9. The system of claim 1, wherein said case comprises an objective housing and a solid immersion lens housing movable with respect to said objective housing, and wherein said optics comprises an objective lens positioned inside said objective lens housing and a solid immersion lens position inside said immersion lens housing.

10. The system of claim 9, wherein said proximity sensor comprises a displacement sensor providing a signal indicating relative displacement between said objective lens housing and said immersion lens housing.

11. The system of claim 10, wherein said displacement sensor comprises a differential variable reluctance transformer.

12. The system of claim 10, further comprising coupling means for resiliently coupling said immersion lens housing to said objective lens housing.

13. The system of claim 10, further comprising coupling means for imparting a non-linear resistive force to compression of said immersion lens housing against said objective lens housing.

14. A system for inspection of integrated circuits, comprising:

an adapter for mounting said integrated circuit thereon;

a controllable two axis motion stage;

a z-motion actuator;

a case situated on said actuator and housing collection optics therein;

a proximity sensor providing signals correlated to the proximity of said collection optics to said specimen;

a controller receiving the signals from said proximity sensor and providing output signal for controlling said actuator.

15. The system of claim 14, wherein said proximity sensor comprises a differential variable reluctance transformer.

16. The system of claim 15, wherein said collection optics comprises a solid immersion lens.

17. The system of claim 16, wherein said solid immersion lens comprises a bi-convex solid immersion lens.

18. The system of claim 16, wherein said solid immersion lens is spring loaded with respect to said case.

19. The system of claim 16, wherein said collection optics further comprises an objective lens.

20. The system of claim 14, wherein said collection optics comprises an immersion lens resiliently held is said case and an objective lens situated inside said case; and wherein said proximity sensor comprises a physical contact sensor.

21. The system of claim 20, wherein said solid immersion lens is a bi-convex immersion lens, and wherein said physical contact sensor is a differential variable reluctance transformer.

22. The system of claim 14, wherein said case comprises an objective housing and a solid immersion lens housing movable with respect to said objective housing, and wherein said optics comprises an objective lens positioned inside said objective lens housing and a solid immersion lens position inside said immersion lens housing.

23. The system of claim 22, wherein said proximity sensor comprises a displacement sensor providing a signal indicating relative displacement between said objective lens housing and said immersion lens housing.

24. The system of claim 23, wherein said displacement sensor comprises a differential variable reluctance transformer.

25. The system of claim 23, further comprising coupling means for resiliently coupling said immersion lens housing to said objective lens housing.

26. The system of claim 23, further comprising coupling means for imparting a non-linear resistive force to compression of said immersion lens housing against said objective lens housing.

27. The system of claim 23, further comprising an interrupt mechanism for preventing compression of said immersion lens housing with respect to said objective lens housing beyond a prescribed value.

28. In a system having a collection optics mounted onto a stage and having a proximity sensor for sensing the distance of the collection optics from the specimen, a method for controlling the landing of the collection optics onto a specimen, comprising the steps of:

a. initializing said stage;

b. obtaining an initial reading from said proximity sensor and setting said initial reading to correspond to initial location of said collection optics;

c. moving said stage to place said optics in x-y registration with a location of interest on said specimen;

d. advancing said optics one step in a z-direction towards said specimen;

e. obtaining a current reading from said proximity sensor;

f. inspecting said current reading to determine whether said optics has reached a proper z-placement with respect to said integrated circuit and, if yes, stopping the process, if not, rep eating steps d and e until the proper z-placement has been reached.

29. The method of claim 28, wherein step b is performed after step c.

30. The method of claim 28, further comprising the step of:

g. calculating a distance Df for start of focus position of said collection optics; and, h. moving said optics in the z-direction an amount corresponding to said distance.

31. The system of claim 1, wherein said collection optics comprises a solid immersion lens resiliently coupled to said case by a loading mechanism.

32. The system of claim 31, wherein said proximity sensor comprises a differential variable reluctance transformer.

33. The system of claim 31, wherein said proximity sensor comprises a strain gauge.

34. The system of claim 31, wherein said proximity sensor comprises a physical contact sensor.

35. The system of claim 31, wherein said proximity sensor comprises a compression sensor.

36. The system of claim 31, wherein said loading mechanism imparts a non-linear resistive force to compression of said immersion lens.

37. The system of claim 31, further comprising an interrupt mechanism.

38. The system of claim 37, wherein said interrupt mechanism receives the signals from said proximity sensor and compares said signals to a preset value to thereby interrupt said controller when a match is detected.

39. The system of claim 38, wherein said interrupt mechanism comprises a Schmidt trigger.

40. The method of claim 28, wherein said collection optics comprises a solid immersion lens, and wherein the method further comprises imparting a resilient force against said immersion lens.

41. The method of claim 40, wherein said resilient force comprises non-linear resistive force.

42. The method of claim 28, further comprising an interrupt step of comparing the current reading from said proximity sensor to a preset value and, if the reading match the preset value, interrupting the process.

* * * * *